United States Patent [19]

Rudelle

[11] Patent Number: 4,728,909

[45] Date of Patent: Mar. 1, 1988

[54] LINEARLY FREQUENCY-MODULATED HIGH-FREQUENCY OSCILLATOR WITH HIGH EXTERNAL Q FACTOR

[75] Inventor: Marie-Irène Rudelle, Aubervillers, France

[73] Assignee: U.S. Philips Corporaton, New York, N.Y.

[21] Appl. No.: 924,548

[22] Filed: Oct. 29, 1986

[30] Foreign Application Priority Data

Oct. 29, 1985 [FR] France .................... 85 16043

[51] Int. Cl.$^4$ ............................................. H03B 5/18
[52] U.S. Cl. ............................ 332/30 V; 331/117 D; 331/177 V
[58] Field of Search .............. 332/16 R, 16 T, 30 V; 331/117 R, 117 FE, 117 D, 177 V

[56] References Cited

U.S. PATENT DOCUMENTS 4,310,809 1/1982 Buck et al. .................... 331/117 D Primary Examiner—Eugene R. LaRoche
Assistant Examiner—Robert J. Pascal
Attorney, Agent, or Firm—Thomas A. Briody; William J. Streeter; Gregory P. Gadson

[57] ABSTRACT

A high-frequency modulator which is linearly modulated in a frequency range around a center frequency and comprises a high-gain field effect transistor whose output is fed-back to the input from a coupler constituted by two relatively fine lines which are sufficiently remote from each other to provide that at the input of the transistor the majority of the high power available at its output is reinjected, and thus a high external Q factor is obtained. The modulation circuit which is arranged in parallel with the feedback network includes a varicap which is arranged in series with three line elements and a fixed capacitor calculated for optimizing the linearity of the frequency modulation as a function of the control voltage of the varicap. The circuit may be used for example, in equipment such as radio altimeter sources or proximity fuses, auto-directional systems and long-range radar.

4 Claims, 5 Drawing Figures

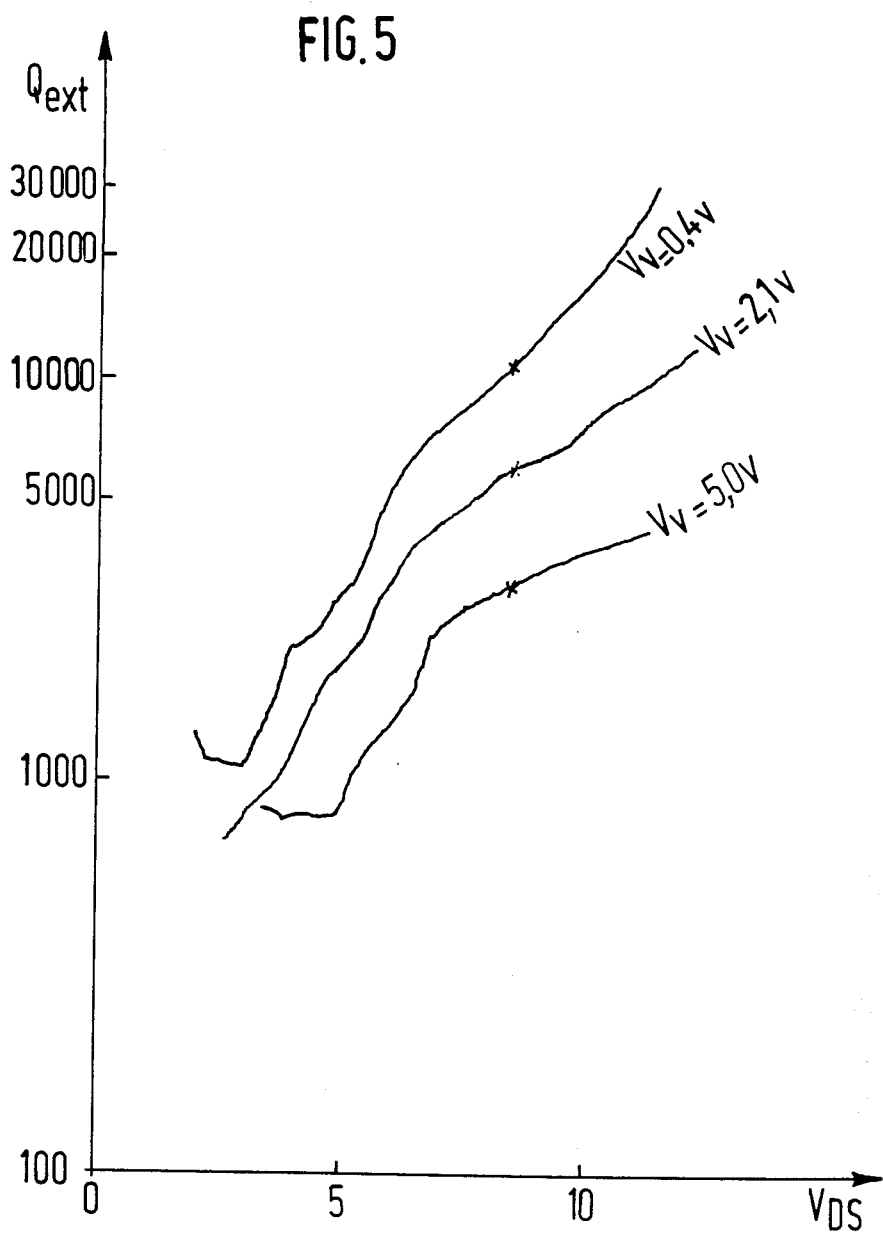

LINEARLY FREQUENCY-MODULATED HIGH-FREQUENCY OSCILLATOR WITH HIGH EXTERNAL Q FACTOR

BACKGROUND OF THE INVENTION

The invention relates to a high-frequency oscillator whose frequency is modulated linearly around a central frequency by means of a variable capacitance diode as a function of a control voltage applied to the terminals of this diode, the oscillator comprising a power transistor whose matching impedances on its input and output electrodes are provided by lines calculated such as to ensure a maximum gain at the central frequency.

The oscillator according to the invention provides an output power from 0.1 to 1 Watt at an operating frequency of some 5 GHz, and is used in all F.M. systems, and more specifically in apparatuses such as radio-altimeter sources or proximity fuses, automatic range finders and long-range radar. In these several applications a proper linearity of the frequency-control voltage characteristic and a very good insulation from noise are required. To satisfy this insulation condition the oscillator must have a high external Q factor.

High-frequency oscillators of the type defined in the opening paragraph are disclosed in, for example, U.S. Pat. No. 4,310,809 which describes an arrangement with negative resistance realized on the basis of a bipolar transistor, and whose frequency variation is controlled by varactors arranged in parallel in the modulation circuit. Oscillators of this type which are of current usage in the field of high-frequencies provide a weak output power, which in the present case, have a value of 10 mW at 8.5 GHz. A method of reducing the sensitivity to exterior influences of such an oscillator consists of providing an insulator at its output.

A further method applicable to a high-power oscillator of the fed-back amplifier type, for example, consists in arranging an attenuator or a directive coupler at the output of this oscillator, but the external Q will only be increased as regards its power ratio.

SUMMARY OF THE INVENTION

The invention has for its object to provide a simpler and more economic method for realizing a high degree of insulation of the oscillator against noise. Such a method is characterized in that, said transistor having a high gain and a high output power, the oscillation is obtained by a stable operating mode of the transistor in said frequency range by means of a feedback network which matches its input voltage to its output voltage, said feedback being obtained at the oscillator output via a line which is weakly coupled by proximity to one of the lines of said feedback network so as to reinject at the input of the transistor, the majority of the high power available at its output, the weak coupling thus realized and the directivity of the coupler on the one hand, and the saturation state of the transistor on the other hand ensuring that the oscillator has a high Q-factor.

Said variable capacitance diode enabling the frequency-modulation and a fixed capacitor are arranged in series between three line elements in a modulation circuit which is arranged in parallel with said feedback network, a terminal of said capacitor being connected to a point of the feedback network via a first line element and the other terminal being connected to the cathode of the diode via a second line element, the anode of the diode being connected to ground via a third line element, said line elements being predefined such as to optimize the linearity of the frequency-modulation as a function of said control voltage.

DESCRIPTION OF THE DRAWINGS

The invention and how it can be put into effect will now be described by way of non-limitative example with reference to an embodiment shown in the accompanying drawings, in which:

FIG. 5 shows the variation of the external Q as a function of the drain voltage for some values of the control voltage.

Corresponding elements in the FIGS. 1 and 2 are given the same reference numerals.

DETAILED DESCRIPTION

Figure 1:
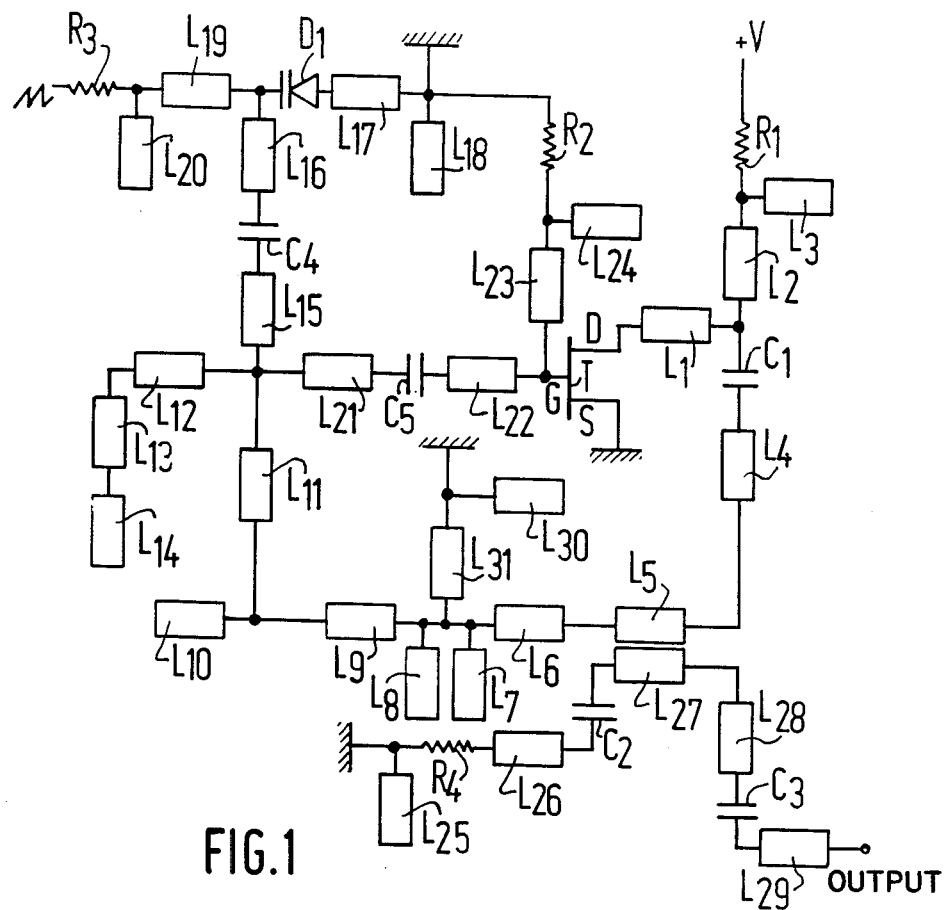
FIG. 1 shows the basic circuit diagram of the high-frequency oscillator of the invention.

The high-frequency oscillator according to the invention, whose circuit diagram is shown in FIG. 1 is obtained on the basis of a fed-back amplifier comprising a field effect transistor T arranged as a common source S connected directly to ground and being capable of providing a power of the order of 500 mW.

The input/output matching of the transistor and the circuit oscillator in the desired frequency band are determined by:

- the series arrangement between the drain D and the grid of the transistor T of the line $L_1$, the capacitor $C_1$, lines $L_4$, $L_5$, $L_6$, $L_9$, $L_{11}$, $L_{21}$, the capacitor $C_5$ and the Line $L_{22}$;
- the series arrangement of the lines $L_{12}$ and $L_{13}$ from the junction points of the lines $L_{11}$ and $L_{21}$; and
- the open lines at one end (stubs) $L_7$–$L_8$, $L_{10}$ and $L_{14}$ provided at the junctions of the lines $L_6$ and $L_9$, $L_3$ and $L_{11}$ and at the free end of the line $L_{13}$, respectively.

The linear frequency modulation is ensured by the circuit formed by arranging in series the line $L_{17}$, the varicap $D_1$, the line $L_{16}$, the capacitor $C_4$, the line $L_{15}$ and arranged in parallel between ground and the junction points of the lines $L_{11}$ and $L_{21}$ to the input-output matching circuit. This matching operation is realized in such a way that the modulus of the reflection coefficient relative to 50 ohms remains large and varies only little as a function of the frequency, and that the phase of this reflection coefficient varies monotonously.

The output power of the oscillator is obtained with the aid of the line $L_{27}$ arranged along line $L_5$.

The directivity of the coupler thus formed is provided by the circuit formed by arranging the resistor $R_4$, the line $L_{26}$, the capacitor $C_2$, the lines $L_{27}$ and $L_{28}$, the capacitor $C_3$ and the line $L_{29}$ in series between ground and the output of the oscillator, a stub $L_{25}$ being provided at that end of the resistor $R_4$ connected to ground.

The drain supply voltage (+V) is applied to the line $L_1$ via the resistor $R_1$ arranged in series with line $L_2$, the stub $L_3$ being provided at the junction of $R_1$ and $L_2$.

The grid G is connected to ground across line $L_{23}$ and resistor $R_2$, the stub $L_{24}$ being provided at the junction between $L_{23}$ and $R_2$.

It should be noted that a grid supply voltage is not required, the transistor being automatically biased when it is highly saturated.

The control voltage for the varicap is applied to its cathode via the series arrangement of resistor $R_3$ and line $L_{19}$, the stub $L_{20}$ being provided at that end of a line $L_{19}$ connected to the resistor $R_3$.

Connecting the anode to ground is provided via the stub $L_{18}$ arranged at the junction of the resistor $R_2$ and line $L_{17}$.

The linearity resulting from this type of modulation is defined as the relative slope variation of the variation characteristic of the oscillator frequency as a function of the control voltage.

In the described example, one single varicap $D_1$ is used, but it is alternatively possible to improve the linearity performances by replacing the capacitor $C_4$ by a second varicap provided in a head-to-tail configuration with the first varicap and biased via the line $L_{31}$ connected between the junction of lines $L_6$ and $L_9$ and stub $L_{30}$ connected to ground.

Figure 2:
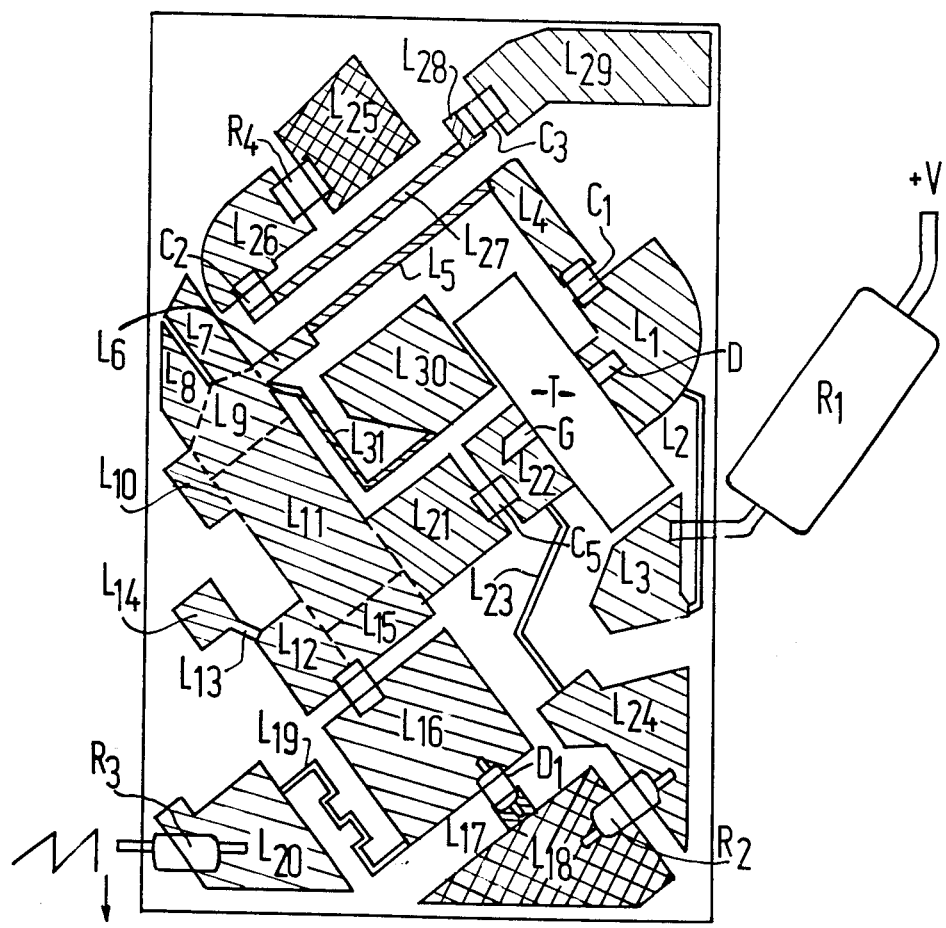
FIG. 2 is a view of a "micro-strip" embodiment of the oscillator.

FIG. 2 shows an embodiment of the oscillator.

Each line of the circuit diagram of FIG. 1 represented by hatched lines is realized with the aid of a conductive layer having a well-defined length and width produced by screen printing on a face of an insulating plate. The other surface which is in connection with the first face via holes drilled in the plate is covered with a uniform conductive coating constituting the ground plane. This technology is known as "strip-line" or "microstrip".

The lines and stub such as $L_1$, $L_4$, $L_5$, $L_6$ $L_7$, $L_8$, $L_9$, $L_{10}$, $L_{11}$, $L_{12}$, $L_{13}$, $L_{14}$, $L_{21}$ and $L_{22}$ belonging to the input-output matching circuit of the transistor T have a relatively large width compared with the lines such as $L_2$, $L_{19}$, $L_{23}$ and $L_{31}$, which have a length of $\lambda/4$ and have a high impedance in order to provide the power supply to the circuit or to connect them to ground. The lines $L_5$ and $L_{27}$ of the coupler are formed by elements of the same length, which have narrow widths relative to said length and are sufficiently remote from each other so as to produce weak coupling. The circuit areas connected to ground are hatched in two directions. The low-frequency components such as the supply resistors $R_1$, $R_2$, $R_3$, $R_4$ and the capacitors $C_1$, $C_2$, $C_3$, $C_4$, $C_5$ are applied by soldering. The field effect transistor T is an AsGa transistor capable of producing an output power of the order of 500 mW.

To provide a drain voltage $V_{DS}$ of the order of 8.5 V and a drain current $I_D$ of the order of 300 mA, the output power of the oscillator is of the order of 40 mW.

The overall dimensions of the oscillator are 24 mm $\times$ 38 mm.

Figure 3:
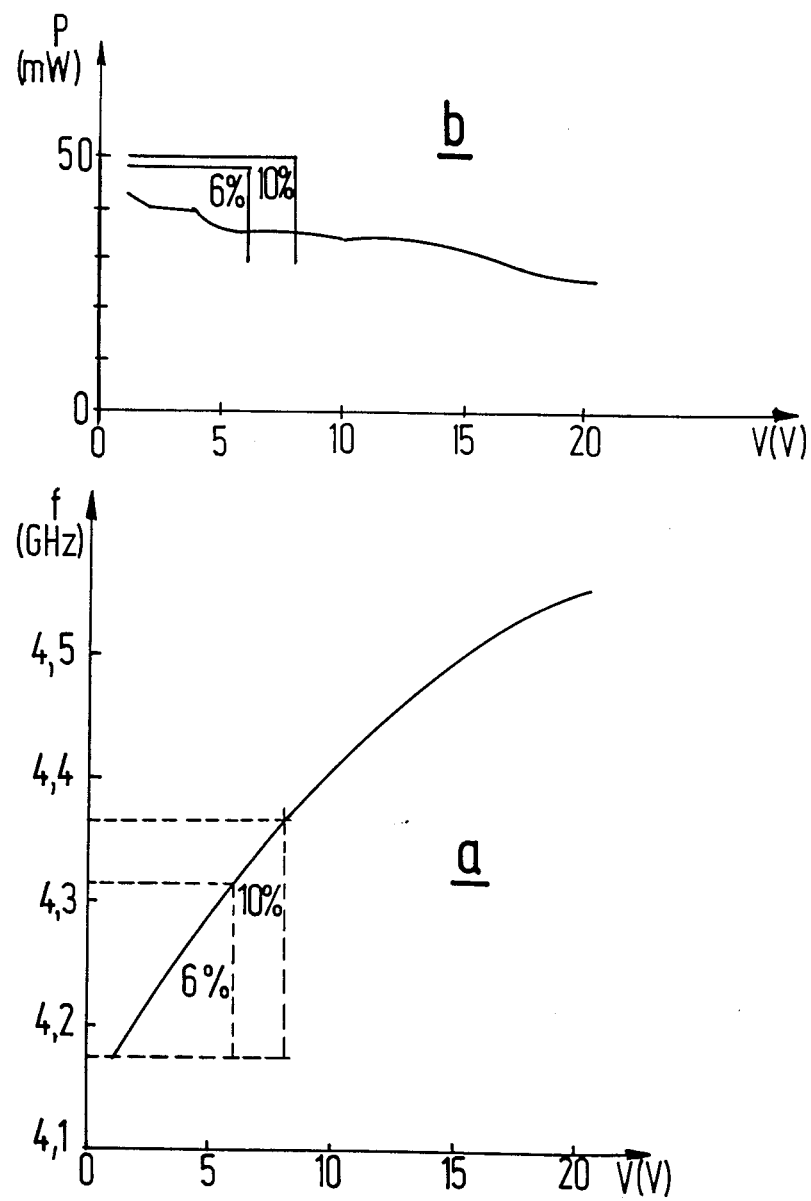
FIG. 3 shows the frequency variations of the oscillator and the power it supplies as a function of the control voltage.

FIG. 3a illustrates an experimental variation characteristic of the output frequency as a function of the varicap control voltage.

Around a center frequency of 4.3 GHz obtained for an 8.5 V varicap control voltage, a study of this characteristic shows a 140 MHz frequency band which is linearly modulated within less than 6%, and a further 190 MHz frequency band which is modulated linearly within less than 10%, the linearity being evaluated in accordance with its strictest definition as the ratio between the maximum and minimum slopes of the characteristic in the frequency band under consideration. As described in greater detail in the foregoing, it is possible to enlarge the linearity zone without modifying the circuit too much, by substituting a second varicap for the fixed capacitor $C_4$.

FIG. 3b, which shows the experimental variation of the output power of the oscillator as a function of the same control voltage shows that said power is of the order of 40 mW for a control voltage of the order of 8.5 V. This output power is ten times weaker than the maximum power available at the output of a strongly coupled, fed-back oscillator utilizing the same transistor.

Figure 4:
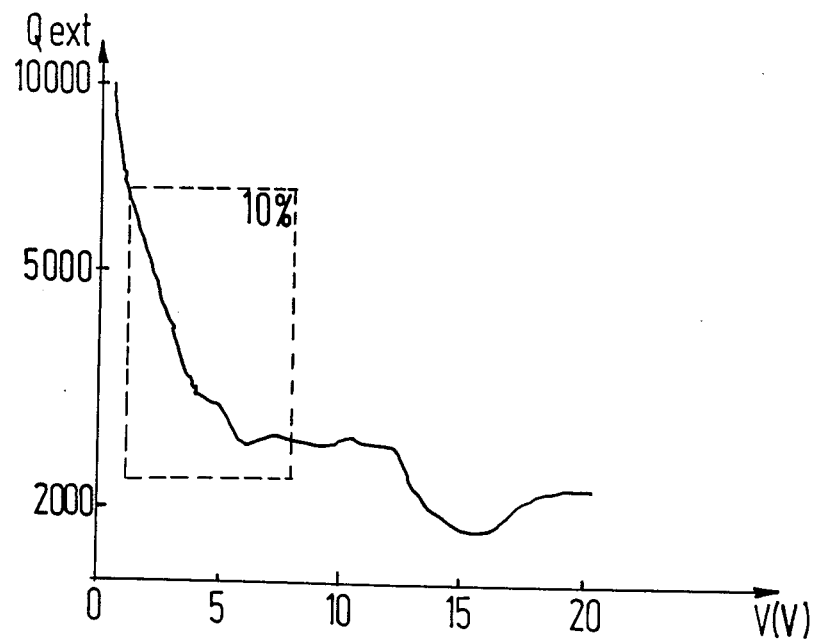
FIG. 4 shows the variation of the external Q of the oscillator as a function of the control voltage.

FIG. 4 shows the variation of the external Q-factor of the oscillator versus the control voltage. The value of this Q-factor is here calculated on the basis of the formula:

$$Q_{ext} = \frac{2f}{\Delta f} \sqrt{\frac{P_b}{P_{osc}}}$$

in which f is the frequency of the oscillator, $P_{osc}$ its power, $P_b$ the noise power used and $\Delta f$ the corresponding synchronizing band of the oscillator.

On an average, the value of $Q_{ext}$ is 70 times higher in the useful modulation band than that of a highly coupled fed-back oscillator utilizing the same transistor and having an identical drain voltage $V_{DS}$ (8.5 V in the present example).

FIG. 5 shows the variation of $Q_{ext}$ versus the drain voltage $V_{DS}$ for some values of the control voltage $V_V = 0.4$ V, 2.1 V and 5 V. A study of these curves shows that it is possible to obtain a higher value for $Q_{ext}$ by increasing the drain voltage $V_{DS}$ without significantly modifying the output power of the oscillator.

What is claimed is:

1. A high-frequency oscillator whose frequency is modulated linearly around a central frequency by means of a variable capacitance diode as a function of a control voltage applied to the terminals of this diode, said oscillator comprising a power transistor whose matching impedances on its input and output electrodes are realized by means of lines which are calculated such as to ensure a maximum gain at the central frequency, characterized in that, said transistor having a high gain and a high output power, oscillation is obtained by a stable operating mode of the transistor in a frequency range by means of a feedback network which matches its input voltage to its output voltage, said feedback being obtained at the oscillator output via a line which is coupled to one of the lines of said feedback network so as to reinject at the input of the transistor the majority of the high power available at its output, the weak coupling thus provided and the directivity of the coupler on the one hand, and the saturation state of the transistor on the other hand ensuring that the oscillator has a high external Q-factor.

2. An oscillator as claimed in claim 1, characterized in that said variable capacitance diode and a fixed capacitor are arranged in series with three line elements in a modulation circuit which is connected in parallel with said feedback network, a terminal of the capacitor being connected to the feedback network via a first line element and the other terminal being connected to the cathode of the diode via a second line element, and a third line element being coupled to the anode of the diode, said line elements being predefined such as to optimize the linearity of the frequency modulation as a function of said control voltage.

3. An oscillator as claimed in claim 1, characterized in that said high-gain, high-power output transistor is a field effect transistor whose source is connected to ground and whose gate and drain are said input and output electrodes, respectively.

4. An oscillator as claimed in claim 2, characterized in that said high-gain, high-power output transistor is a field effect transistor whose source is connected to ground and whose gate and drain are said input and output electrodes, respectively.

* * * * *